United States Patent

[11] 3,614,645

[72] Inventor Carl Franklin Wheatley, Jr.
Somerset, N. J.
[21] Appl. No. 847,879
[22] Filed Aug. 6, 1969
[45] Patented Oct. 19, 1971
[73] Assignee RCA Corporation
[32] Priority Sept. 27, 1968
[33] Great Britain
[31] 46151/68

[54] DIFFERENTIAL AMPLIFIER
17 Claims, 3 Drawing Figs.

[52] U.S. Cl. .......... 330/30 D, 330/17, 330/19
[51] Int. Cl. .......... H03f 3/68
[50] Field of Search .......... 330/17, 19, 30, 30 D, 38 M, 69

[56] References Cited

UNITED STATES PATENTS 3,259,758 7/1966 Hobrough .......... 330/69 X
3,440,554 4/1969 McGraw et al. .......... 330/30 X
3,482,177 12/1969 Sylvan .......... 330/69 X

*Primary Examiner*—Roy Lake
*Assistant Examiner*—Lawrence J. Dahl
*Attorney*—Eugene M. Whitacre

ABSTRACT: A differential amplifier comprising a pair of transistors of one conductivity type has an active load circuit comprising a second pair of transistors of the opposite conductivity type, one connected in series with each transistor of the first pair. A third pair of transistors of the opposite conductivity type have their emitter electrodes connected in common to the base electrodes of the second pair, and their base electrodes individually connected to the collector electrodes of the second pair. The active load varies its conductivity as a function of common mode currents while developing a substantially constant voltage drop. Differential signal currents develop significant voltage drops which are simultaneously coupled by the third pair of transistors to an output load circuit.

INVENTOR.
Carl F. Wheatley, Jr.
BY Eugene M. Whitacre
ATTORNEY

INVENTOR.
Carl F. Wheatley, Jr.
BY
Eugene M. Whitacre
ATTORNEY

DIFFERENTIAL AMPLIFIER

This invention relates to amplifier circuits and more particularly to circuits especially suited for integrated circuit techniques.

Integrated circuit amplifiers of the type referred to as operational amplifiers have been made using integrated circuit techniques. The flexibility of application of these amplifiers in different circuit environments has been limited. Voltage gain versus frequency response has been established by the integrated circuit designer to criteria determined by an expected application. Input and output impedances have also been a fixed part of the circuit design included on the integrated circuit semiconductor wafer. Therefore, many operational amplifiers have been designed for different applications requiring high or low input impedance, low or high voltage gain, high or low power output for various loads.

Feedback circuit design for operational amplifiers has provided some flexibility in application. However, the voltage gain, as well as the frequency response characteristic has placed strict limits under penalty of instability or self-oscillation on the adaptability to various applications.

Operational amplifiers as defined in textbooks have high input impedance, low output impedance and a characteristic voltage gain. Additionally, the voltage gain and phase shift as a function of frequency must be designed to permit the use of negative feedback circuits with stable operation. Operational amplifier performance with feedback circuits has traditionally been described in textbooks by formulas in terms of the voltage gain characteristic. This characteristic has been relied upon because amplifiers usually have a load resistor integral to the amplifier which defined the available voltage gain.

Application of integrated circuit operational amplifiers would be greatly enhanced if performance characteristics could be adapted to the needs of an application by means external to the encapsulation.

Therefore, it is an object of this invention to provide an a amplifier the gain of which is determined by external circuits.

It is further an object of this invention to provide an integrated circuit amplifier whose input impedance is adjustable by external means.

To accomplish these objectives, an operational amplifier has been developed incorporating a novel differential amplifier as an input circuit. Input impedance may be varied over a very wide range by varying transistor emitter to collector currents. Voltage gain is determined by an externally connected load resistor in addition to the control on transistor operating current. High common mode rejection and amplifier frequency response is exhibited by the circuit.

A differential amplifier embodying this invention includes first and second transistors connected to provide a differential amplifier with a third and fourth transistor respectively connected as load impedances for said first and second transistors. Coupling means are provided to couple a voltage proportional to the common mode current output of the first and second transistors to the input of the third and fourth load transistors to vary their conductance. The coupling means includes a voltage threshold device such as a semiconductor rectifying junction between the base and collector electrodes of said third and fourth transistors whereby the voltage drop across the load transistors is maintained substantially constant.

In an embodiment of the invention, the coupling means includes a differential amplifier having fifth and sixth transistors with the base and emitter electrodes respectively coupled between the collector and base electrodes of the third and fourth transistors to couple the common mode voltage to the load transistor inputs and simultaneously amplify differential currents.

The novel features which are considered to be characteristic of this invention are set forth with particularity in the appended claims. The invention itself, however, both as to its organization and method of operation, as well as additional objects and advantages thereof, will best be understood by reference to the accompanying drawings in which:

Figures 1, 2:
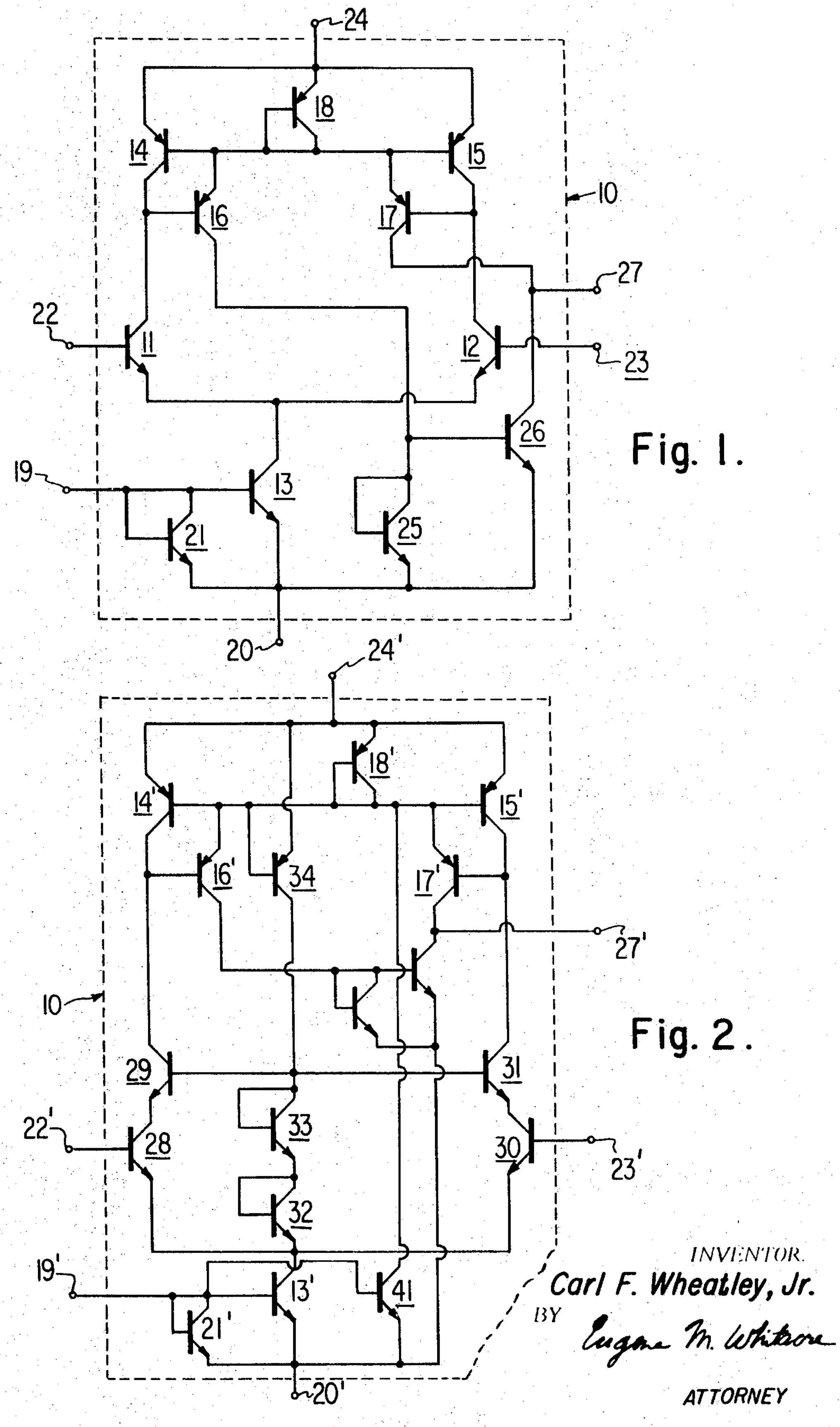
FIG. 1 is a schematic circuit diagram of a differential amplifier embodying the invention.
FIG. 2 is a schematic diagram of the differential amplifier including a high gain input amplifier stage and biasing network.

All of the elements shown within the dashed rectangle 10 are formed as an integrated circuit on a single semiconductor wafer. The integrated circuit is a differential amplifier including a pair of transistors 11 and 12, a current source transistor 13, and an active load circuit comprising five transistors 14, 15, 16, 17 and 18, the latter being connected as a diode. An external source of current, not shown, may be coupled between terminal 19 and common terminal 20 to establish a voltage across diode 21, the diode 21 being connected between the input electrodes of transistor 13. The diode 21 comprises a transistor with the collector and base electrodes connected together. Since transistor 13 and diode 21 are formed on the same semiconductor wafer at the same time, their electrical characteristics will be accurately matched. If the transistor 13 and diode 21 are equal area devices fabricated on a single semiconductor wafer, the emitter current injections into the base regions will be equal. The current flow which forward biases transistor 13 and diode 21 establishes equal base emitter voltage drops and, therefore, equal emitter currents. The emitter current in transistor 13 is equal to the sum of the base and collector currents and most of the emitter current flows to the collector. The current flow between terminal 19 and 20 is equal to the emitter current of diode 21, plus the small base current into transistor 13. Due to the high ratio between base and collector currents in transistor 13 and the equal areas of the transistor 13 and diode 21, the current flow between terminal 19 and 20 and the current in the collector of transistor 13 are substantially equal. Therefore, the current supplied by the current source transistor 13 is easily and accurately determined by the parameters of an external source, not shown, connected between terminal 19 and common reference terminal 20.

The combination of a diode connected transistor between the base and emitter electrodes of a second transistor will be referred to as a diode-transistor composite. The voltage drop developed between the base and emitter electrodes of a transistor when the transistor is subjected to a significant forward bias current will herein be referred to as $V_{be}$. The collector current of transistor 13 is supplied to the emitter electrodes of transistors 11 and 12. The current will divide between the transistors 11 and 12, depending upon the difference of signal input voltages applied to the base electrodes of transistors 11 and 12 via input terminals 22 and 23 respectively. If the voltages applied to the input terminals 22 and 23 are equal, the current supplied by the transistor 13 will divide equally between the transistors 11 and 12.

The active load circuit comprising transistors 14, 15, 16, and 17 connects the collector electrodes of transistors 11 and 12 to a source of operating potential connected between terminal 24 and 20. Transistors 14, 15, 16 and 17 are opposite conductivity types compared to transistors 11 and 12.

The transistors 14 and 15 are connected in series with transistors 11 and 12 respectively. The transistors 16 and 17 which are connected in a differential configuration, have their emitter electrodes connected on common to the base electrodes of transistors 14 and 15, and through a diode connected transistor 18 to the operating potential supply terminal 24. The base electrodes of the transistors 16 and 17 are connected respectively to the collector electrodes of transistors 11 and 12.

The collector electrode of transistor 16 is connected through a diode connected transistor 25 to the reference terminal 20. The diode 25 is connected between the base and emitter electrodes of an output transistor 26. The transistor 26 and the transistor 17 are connected in series, and an output terminal 27 is connected to the collector electrodes of these transistors.

The connection of the transistors 14, 16, 15, and 17 provides a mechanism whereby the conductances of transistors 14 and 15 are automatically set to accommodate the current from transistor 13, which is established by the external source connected between terminals 19 and 20. This is brought about because the base drive for transistors 14 and 15 is controlled by the transistors 16 and 17 as functions of the current through transistors 11 and 12. Even though the current through transistor 13 may be established at any point in a relatively wide range of currents, the voltage across the load transistors 14 and 15 does not change appreciably. The collector to emitter voltage of transistors 14 and 15 is $2V_{be}$, which is the sum of the voltage across the base-emitter junctions of transistors 14 and 16 and of transistors 15 and 17. As a result, insignificant common mode signal voltage is developed across transistors 14 and 15.

The collector impedance of transistors 14 and 15 is relatively low for common mode current in that the collector-to-emitter voltage of these transistors is substantially constant for a wide change in common mode current. For differential currents, the transistors 16 and 17 have equal and opposite changes in current so that the base drive to transistors 14 and 15 remains equal and unchanged. As a result, the collector impedance of transistors 14 and 15 to differential mode currents is very high, and substantially all of the differential mode current flows through the base-emitter paths of transistors 16 and 17.

The load circuit as described provides a modulated conductance in accordance with common mode current changes and provides a high load impedance for differential current flow. This load circuit provides common mode signal rejection over and above the common mode rejection normally provided by the differential amplifier circuit configurations.

As mentioned above, transistors 16 and 17 are connected with their emitters in common and operate as a second differential amplifier the collector currents of which are beta times the difference signal current applied to the base electrodes thereof. A transistor connected as a diode 18 is shown in FIG. 1 connected in series with the emitter collector current path of transistors 16 and 17 and between the base and emitter electrodes of both transistor 14 and transistor 15. Diode 18 is forward biased by the common mode emitter collector current of transistors 16 and 17 and forms in conjunction with transistors 14 and 15 a diode-transistor composite. When diode 18 junction area is made twice the junction area of transistor 14 and transistor 15, then 2 microamperes current flow in diode 18 will establish one microampere current flow in transistor 14 and in transistor 15.

By way of example, if a 2 microampere bias current is established in diode 21, 1 microampere will flow in each of the transistors 11 and 12, and 1 microampere will flow in transistors 14 and 15. Since the diode 18 junction area is twice the base-emitter junction area of transistor 14 and 15 and series connected with transistors 16 and 17, the current in diode 18 is 2 microamperes and equals the sum of 1 microampere in each of the transistors 16 and 17.

The transistor connected as a diode 25 and transistor 26 form a diode-transistor composite having a current gain of unity. Equal quiescent currents flowing from the collectors of transistors 16 and 17 establish a collector current in transistor 26 equal to the transistor 16 collector current. The output impedance of the collectors of transistors 17 and 26 may be very high dependent on the device fabrication. A load circuit for transistors is then coupled to an output terminal 27 which is connected in common to the collectors of transistors 17 and 26.

As described above, wide ranges in operating current may be transistors in transistors 11, 12, 13, 14, 15, 16, 17, 18, 25 and 26. By way of example, the integrated circuit of FIG. 1 has been operated in the range of emitter to collector current of 20 nanoamperes to 400 microamperes.

Since the output collector impedance of transistors 17 and 26 is high, the voltage gain of the operational amplifier is determined by the external load resistance used and may be determined by computation using the transconductance of the amplifier. The transconductance would be the change in output current for a change in differential voltage across the input terminals 22 and 23.

The transconductance of that portion of the differential amplifier including only transistors 11 and 12 is $$gm=(39X\ I_e/2)\ \text{mho}$$

where $I_e$ is the emitter current for one of the transistors 11 and 12 in amperes;

and where the transconductance is defined as the change in one collector output current for a change in voltage between terminals 22 and 23.

Since the differential collector current flows through the base emitter paths of transistors 16 and 17, transistors 16 and 17 contribute a beta multiplier to the current gain of the differential amplifier. The output current of transistor 16 flows through the diode 25 to develop an equal and opposite phase output from transistor 26. The output current from transistor 17 then combines with the output current from transistor 26 to drive a load coupled to them through terminal 27. The overall transconductance then is:

$$gm=39\beta I_e \text{mho}$$

where $\beta$ is the beta of transistory 16 and 17, and $I_e$ is the emitter current of one of transistors 11 and 12.

An example of the amplifier transconductance available at a transistor 11 current of 1 microampere, if the beta of transistor 16 equals 50 is: $gm=39\times50\times1\times10^{16}$mho $=1950$ micro mho. The voltage gain is then simply output voltage divided by input voltage or:

$$Vo/Vi=R_L$$

where $R_L$ is the output load resistance connected to terminal 27.

The maximum common mode input which upsets the operation of the differential amplifier input stage is determined by the sustaining voltage characteristics of the current source comprising transistor 13 and the required voltage drop across the load transistors 14 and 15 which both subtract from the available voltage of the supply. In the circuit shown in FIG. 1, input common mode voltages at terminals 22 and 23 may swing to a negative limit equal to the negative source voltage at terminal 20 plus 0.8 volt and to a positive signal limit of the positive source voltage at terminal 24 minus 1.4 volts without upsetting differential amplifier operation. Maximum common mode input is primarily determined by supply voltage reduced by very small magnitudes since both the source transistor 13 and the load transistors 14 and 15 require very small voltage drops for effective operation.

FIG. 2 shows a differential amplifier including cascode connected pairs of transistors 28, 29 and 30, 31 which provide improved common mode rejection and improved low noise provide Transistors 28 and 30 are special design input amplifier transistors coupled to input terminals 22′ and 23′. Transistors 28 and 30 are high beta (super beta) transistors having beta values of the order of 1,000 and very low collector to emitter breakdown voltages of the order of 1 volt. In conventional higher voltage transistors, the beta of the transistor is substantially constant as a function of collector voltage in the low voltage range of operation. However, at higher voltages in the range of values approaching $V_{ceo}$, collector current is both a function of base current and also collector voltage. $V_{ceo}$ is defined as the collector to emitter breakdown voltage with the base electrode open circuit and unconnected.

Transistors in general are characterized by a collector-to-base leakage current proportional to the collector to base voltage for values less than 50 millivolt. This collector-to-base leakage characteristic contributes to poor noise performance for small signal inputs and has an undesirable temperature dependence characteristic.

Poor noise performance and temperature dependence is suppressed by a unique bias circuit which not only establishes a relatively fixed low collector voltage for operation of transistors 28 and 30 but establishes essentially zero collector to base voltage in transistors 28 and 30, such that the collector to base leakage current is also reduced to zero. Noise performance is greatly enhanced and use of the high beta transistor is, therefore, possible in the input stage of an operational amplifier.

Transistors 28, 29 and 30, 31 are cascode connected wherein 28 and 30 are operated common emitter deriving emitter current from source transistor 13' which may be similar to that described in FIG. 1. Transistors 29 and 31 are operated common base wherein the base electrodes are returned to the emitters of transistors 28 and 30 through a bias supply comprising transistors 32 and 33 connected as diodes. The collector output of transistors 29 and 31 is coupled to a load circuit comprising transistors 14', 15', 16', 17', and 18' similar to that described in FIG. 1.

Diodes 32 and 33 are forward biased and develop 2 $V_{be}$ of bias between the commonly connected base electrodes of transistors 29 and 31 and the emitters of transistors 28 and 30. The voltage drop across the base-emitter junction of transistors 29 and 31 is one $V_{be}$ so that one $V_{be}$ is developed between the collector and emitter electrodes of transistors 28 and 30. The transistors 28 and 30 are biased to conduct st that one $V_{be}$ of forward bias voltage is developed between the base and emitter electrodes thereof. Negligible voltage then appears between the collector and the base of transistors 28 and 30 resulting in very low leakage current as discussed above.

To minimize the voltage between the collector and base electrodes of transistors 28 and 30, the base-emitter junction areas of transistors 29, 31 and 33 are made equal and processed identically, and transistor 32 is a high beta and low breakdown device of equal area not processed identically to high beta transistors 28 and 30. The average currents passed through the two paths 28, 29 and 30, 31 are each made equal to the current through diodes 33, 32. The $V_{be}$ voltage drops across collector-to-emitter of transistors 28, 30 are equal to one $V_{be}$ voltage drop as developed across ultra high beta transistor 32. Since the base-to-emitter voltage of transistors 28 and 30 is also equal to the $V_{be}$ voltage as developed across diode 32, there is zero voltage drop between the collector and base electrodes of transistors 28 and 30.

The bias supply comprising diodes 32 and 33 is energized by current supplied by an additional transistor 34 which is forward biased by the voltage drop across diode 18'. The junction area ratio of diode 18' to the base emitter junction of transistor 34 establishes the current flowing through diodes 32 and 33 which must also flow into source transistor 13'. Therefore, the base-emitter junction of source transistor 13' is made 50 percent larger in area than transistor 13 as described in FIG. 1 because it must supply 50 percent more current.

With 3 microamperes flowing in transistor 13', 1 microampere flows in each of the transistors 28 and 30 and in diode 32. The current in transistor 14' and 15' is 1 microampere each and transistors 16' and 17' each conduct 1 microampere. With transistors 16' and 17' each conducting 1 microampere diode 18' conducts 2 microamperes. The transistor 34 base-emitter junction area is half that of diode 18 and thus is caused to conduct 1 microampere which then flows through bias diodes 32, and 33. The magnitude of all these currents is controlled from the single input terminal 19' where bias current is supplied to diode 21' to control the current supplied by transistor 13'.

When a source voltage is applied to terminals 24' and 20' and an operating bias is applied to diode 21', transistor 13' will conduct current into transistors 28 and 30. However, upon the application of a source to terminals 24' and 20', no initial bias current will be supplied to the bias diodes 32 and 33 to cause conduction in transistors 29 and 31 and therefore, no conduction will occur in transistors 14, 15, and 18. In the absence of diode 18' conduction and therefore conduction in transistor 34, zero collector to emitter voltage will be developed across transistors 28 and 30. Therefore, in the absence of collector to emitter voltage, all current flow from transistor 13' will flow in the base emitter path of transistors 28 and 30 and into signal sources coupled to terminals 22' and 23'. To provide initial conduction in diode 18', a small area transistor 41 is added having its base emitter input coupled across diode 21' and having its collector connected to diode 18'. Transistor 41 need only supply a very small start current to diode 18' to initiate the turn on cycle and its current contribution need only be so small that it need not interfere with the area ratio specification of diode 18' and transistors 14, 15, 16 and 17.

Since the voltage drop across transistors 28 and 30 is low, peak to peak common mode input voltages at terminals 22' and 23' may be nearly as large as the power supply voltage used without affecting the operation of the amplifier as previously described.

With a high beta input transistor input impedances are correspondingly higher such that higher emitter current may be developed in a given application and, therefore, higher transconductance may be established consistent with the high emitter current. Betas in the range of 1,000 have been attained with satisfactory low noise performance. This practical performance depends on the two factors: (1) that of maintaining constant collector voltage to within a narrow range; and (2) that of establishing zero collector to base voltage for zero leakage currents.

High orders of common mode rejection are maintained because the use of integrated circuits results in easy achievement of balance between the two halves of the differential amplifier. The transistor construction used to fabricate the PNP transistors is a lateral construction along the surface of the semiconductor wafer. PNP laterals are characterized by low beta and by emitter to collector currents which are a function of emitter to collector voltage. Therefore, the gain of transistor 17' may be a function of output voltage signal swing upsetting the balance of equal gain in transistors 16' and 17'. However, for relatively low output voltage swings, which may be achieved using relatively a low output impedance load connected to terminal 27', the balance between the differential halves will be preserved.

Figure 3:
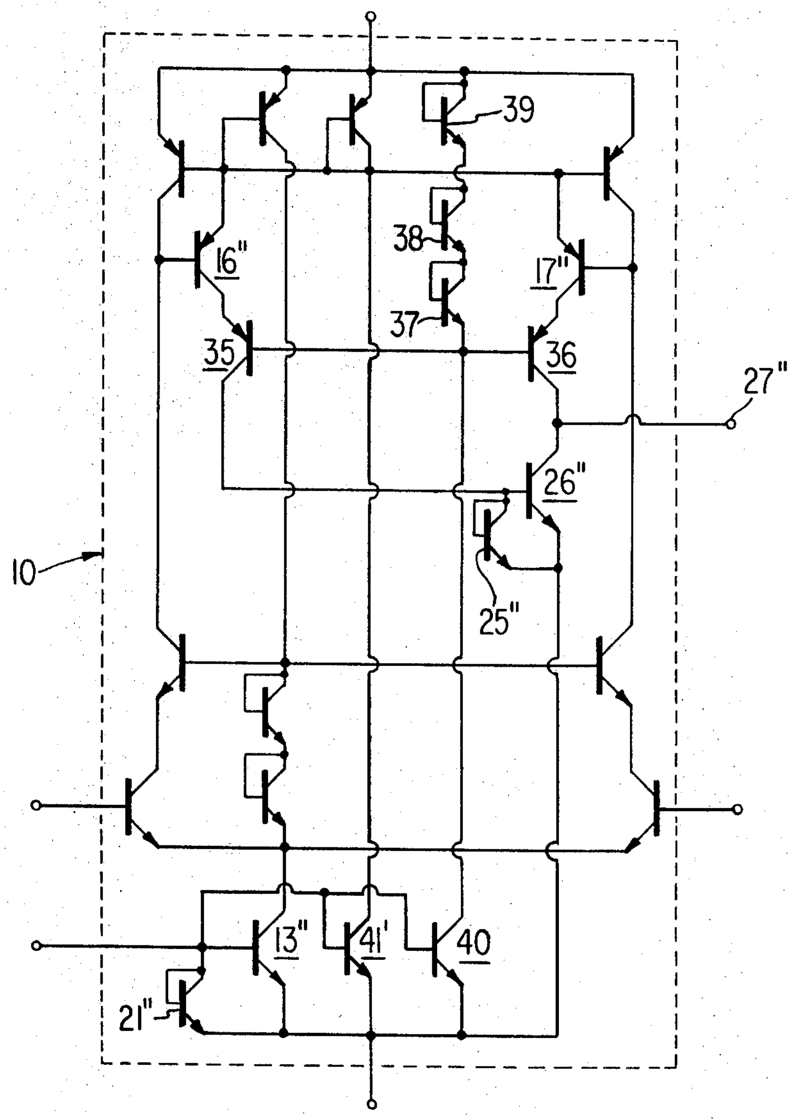
FIG. 3 is a schematic diagram of an operational transconductance amplifier including the differential amplifier.

FIG. 3 shows an additional pair of cascode connections of transistors 16'' and 17'' with transistors 35 and 36 to establish constant collector to emitter voltage in transistors 16'' and 17'' to maintain equal gain in each half of the differential amplifier. A bias circuit comprising diodes 37, 38 and 39 provides base bias for transistors 35 and 36 when a current flows in the diodes derived from a second current source transistor 40. The magnitude of bias current through the diodes 37, 38 and 39 is not critical for providing base voltage to transistors 35 and 36. However, by biasing transistor 40 from diode 21'' as is the case of transistor 13'' in FIG. 3, the current in diodes 37, 38 and 39 can be made to track the currents in all the other transistors. A start circuit including transistor 41' is included to provide start current as described in reference to FIG. 2. A low bias current can be set for low dissipation operation when all the other transistors are so operated and conversely a high current for high current operation. Transistors 35 and 36 are coupled to the output terminal 27'' by means of a diode 25'', transistor 26'' composite as described under FIG. 1 to drive a load push pull with respect to a ground reference. The amplifier is characterized as having a transconductance gain factor since the voltage gain is determined by the external load used. Such operation establishes an additional degree of freedom for the user greatly increasing the range of applicability to diverse function problems.

What is claimed is:

1. A differential amplifier comprising:
   a pair of amplifier stages each having input, common and output electrodes and
   a load circuit coupled to said output electrodes, said load circuit comprising:
      first and second transistors each having base, emitter and collector electrodes;
      means connecting said emitter electrodes in common to a source of operating potential;

means coupled between said base and emitter electrodes of said transistors for providing equal voltages between said base and emitter electrodes of both transistors;

means for coupling said collector electrodes one to each of said output electrodes; and common mode coupling means connected between said output electrodes and said base electrodes including a pair of semiconductor junction devices each providing a current versus voltage coupling characteristic wherein voltage across each said device is equal to or greater than a threshold value for a relatively wide range of current values.

2. A differential amplifier as defined in claim 1 wherein:

said pair of semiconductor devices comprise third and fourth transistors having a base to emitter current versus voltage characteristic wherein said voltage is equal to or exceeds a threshold value for a relatively wide range of current values.

3. A differential amplifier as defined in claim 2 wherein:

said third and fourth transistors have emitter electrodes coupled in common to said base electrodes of said first and second transistors and base electrodes each coupled to said output electrodes of said amplifier stages, and have collector electrodes providing output terminals for coupling to an output circuit.

4. A differential amplifier as defined in claim 2 wherein:

a diode is connected directly between and is poled for forward conduction in the same direction as said base and emitter electrodes of said first transistor.

5. A differential amplifier as defined in claim 1 wherein:

said pair of amplifier stages each include:

a cascode connected pair of transistors having common electrodes and wherein the amplifier stages have a common bias circuit comprising a pair of series connected diodes connected between the common electrodes of the cascode connected transistors.

6. A differential amplifier as defined in claim 5 wherein:

one of said transistors in each of said cascode connected pair of transistors has an extremely low collector to emitter breakdown voltage and is characterized by extremely high beta current gain.

7. A differential amplifier as defined in claim 6 wherein:

one of said diodes in said common bias circuit is a transistor having matched electrical characteristics to said high beta gain transistors which is connected as a diode.

8. An amplifier comprising first and second transistors each having base, emitter and collector electrodes;

means providing a current source connected between the emitter electrodes of said first and second transistors and a first terminal;

third and fourth transistors each including emitter, collector and base electrodes;

means connecting the collector electrodes of said first and third transistors;

means connecting the collector electrodes of said second and fourth transistors;

means connecting the base electrodes of said third and fourth transistors;

means connecting the emitter electrodes of said third and fourth transistors in common to a second terminal;

fifth and sixth transistors each including base, emitter and collector electrodes;

means connecting the emitter electrodes of said fifth and sixth transistors in common to the base electrodes of said third and fourth transistors;

means connecting the base electrode of said fifth transistor to the collector electrode of said third transistor for maintaining the voltage drop between the base and emitter electrodes of said fifth transistor and the collector-to-base voltage of said third transistor substantially equal;

means connecting the base electrode of said sixth transistor to the collector electrode of said fourth transistor for maintaining the voltage drop between the base and emitter electrodes of said sixth transistor and the collector-to-base voltage of said fourth transistor substantially equal;

means providing first and second signal input terminals connected to the base electrodes of said first and second transistors respectively; and output circuit means for connection to the collector electrodes of said fifth and sixth transistors.

9. An amplifier as defined in claim 8 wherein said output circuit means includes a seventh transistor including base, emitter and collector electrodes;

means connecting the collector electrodes of said sixth and seventh transistors for providing a single-ended signal output terminal;

means connecting the base electrode of said seventh transistor to the collector electrode of said fifth transistor;

an eighth transistor having base and collector electrodes connected in common to said base electrode of said seventh transistor and an emitter electrode connected to said emitter electrode of said seventh transistor; and means connecting the emitter electrode of said seventh transistor to said first terminal.

10. A differential amplifier according to claim 4 wherein:

conduction characteristics of said diode and said first and second transistors are proportionally related.

11. A differential amplifier according to claim 9 and further comprising:

a ninth transistor having base and collector electrodes connected in common to said base electrodes of said third and fourth transistors and an emitter electrode connected to said second terminal, conduction characteristics of said third, fourth and ninth transistor being proportionally related.

12. A differential amplifier according to claim 11 wherein:

said first, second, seventh and eighth transistors are of one type conductivity and said third, fourth, fifth, sixth and ninth transistors are of a second type conductivity.

13. An amplifier comprising:

first and second transistors of a first type conductivity each having base, emitter and collector electrodes;

means for providing a source of current connected between a first supply terminal and said emitter electrodes of said first and second transistors;

first and second active device load circuits connected between a second supply terminal and said collector electrodes of said first and second transistors, respectively;

each said load circuit comprising a diode-connected transistor and a further transistor, said diode-connected and further transistors having proportionally related conduction characteristics and being of a second type conductivity;

signal combining means comprising a diode-connected transistor, having collector and base electrodes connected together and an emitter electrode direct current coupled to a second supply terminal, and an output transistor having base and emitter electrodes connected to corresponding electrodes of said last-named diode-connected transistor and a collector electrode connected to a single-ended output terminal, said last-mentioned transistor and diode-connected transistor having proportionally related conduction characteristics and being of said first type conductivity;

each of said load circuits having a collector output electrode, said collector output electrode of said first load circuit being connected to said base electrode of said output transistor and said collector output electrode of said second load circuit being connected to said single-ended output terminal.

14. An amplifier according to claim 13 and further comprising:

first and second sources of voltage connected, respectively, to said first and second supply terminals, and means coupled to said base electrodes of said first and second transistors for supplying input signals referenced to a voltage substantially midway between voltages of said sources.

15. An amplifier according to claim 14 wherein:

said means for providing a source of current comprises a diode-connected transistor and a current source transistor having proportionally related conduction characteristics and being of said first type conductivity for providing to the joined emitter electrodes of said first and second transistors a current proportional to a control current supplied to said diode-connected transistor.

16. An amplifier according to claim 15 wherein:

said first and second sources of voltage provide substantially equal voltages of opposite polarity with respect to a common reference.

17. An amplifier according to claim 16 wherein:

said first type conductivity corresponds to NPN transistors and said second type conductivity corresponds to PNP transistors, and said first and second voltage sources are, respectively, of negative and positive polarity.

UNITED STATES PATENT OFFICE
CERTIFICATE OF CORRECTION

Patent No. 3,614,645 Dated October 19, 1971

Inventor(s) Carl Franklin Wheatley, Jr.

It is certified that error appears in the above-identified patent and that said Letters Patent are hereby corrected as shown below:

Column 2, line 63, that portion reading "on" should be -- in --. Column 4, line 25, that portion reading "transistory" should read -- transistors --; line 29, that portion reading "$10^{16}$mho" should read -- $10^{-6}$mho --; line 32, that portion reading "$V_O/V_i = R_L$" should read -- $V_O/V_i = gmR_L$ --; lines 53-54, that portion reading "provide" should read -- operation --. Column 5, line 22, that portion reading "st" should read -- so --; line 32, that portion reading "not" should read -- and --. Column 8, line 59, that portion reading "a second" should read --said first --; line 63, that portion reading "connected" should read -- direct current coupled --; line 70, that portion reading "connected" should read -- direct current coupled --; line 72, that portion reading "connected" should read -- direct current coupled --.

Signed and sealed this 1st day of August 1972.

(SEAL)
Attest:

| | |
|---|---|
| EDWARD M.FLETCHER,JR. | ROBERT GOTTSCHALK |
| Attesting Officer | Commissioner of Patents |

M PO-1050 (10-69)

USCOMM-DC 60376-P69
U.S. GOVERNMENT PRINTING OFFICE : 1969 O—366-334